(12) United States Patent
Kwak

(10) Patent No.: US 7,157,332 B2
(45) Date of Patent: Jan. 2, 2007

(54) METHOD FOR MANUFACTURING FLASH MEMORY CELL

(75) Inventor: Noh Yeal Kwak, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/880,202

(22) Filed: Jun. 29, 2004

(65) Prior Publication Data

US 2005/0153509 A1 Jul. 14, 2005

(30) Foreign Application Priority Data

Jan. 9, 2004 (KR) ............. 10-2004-0001749

(51) Int. Cl.
*H01L 21/336* (2006.01)
(52) U.S. Cl. ............. 438/257; 438/258; 438/593; 438/261; 438/775; 438/791; 438/E21.68; 438/E29.129; 257/314; 257/315; 257/316
(58) Field of Classification Search ........ 438/257–258, 438/261–265, 593–594; 257/315–316
See application file for complete search history.

(56) References Cited

U.S. PATENT DOCUMENTS

| 5,907,183 | A | 5/1999 | Takeuchi | |
| 6,228,717 | B1 * | 5/2001 | Hazama et al. | 438/265 |
| 6,610,614 | B1 | 8/2003 | Niimi et al. | |
| 6,627,494 | B1 * | 9/2003 | Joo et al. | 438/240 |
| 2003/0119260 | A1 | 6/2003 | Kim et al. | |
| 2004/0171241 | A1 * | 9/2004 | Kitamura et al. | 438/592 |

OTHER PUBLICATIONS

Preliminary Notice of Rejection of the IPO for Application No. 093119261.

* cited by examiner

*Primary Examiner*—Dung A. Le
(74) *Attorney, Agent, or Firm*—Marshall, Gerstein & Borun LLP

(57) ABSTRACT

Disclosed is a method for manufacturing a flash memory cell. A structure in which a floating gate, an ONO dielectric film and a control gate are stacked is formed by means of a gate mask process and an etch process. After a rapid thermal nitrification process is performed, a re-oxidization process is performed. Therefore, Si-dangling bonding broken during the gate etch process becomes a Si—N bonding structure by means of a rapid thermal nitrification process. As such, as abnormal oxidization occurring at the side of an ONO dielectric film during a re-oxidization process is prohibited, a smiling phenomenon of the ONO dielectric film is prevented.

8 Claims, 3 Drawing Sheets

METHOD FOR MANUFACTURING FLASH MEMORY CELL

This application relies for priority upon Korean Patent Application No. 2004-1749 filed on Jan. 9, 2004, the contents of which are herein incorporated by reference in their entirety.

BACKGROUND

1. Field of the Invention

The present invention relates to a method for manufacturing a flash memory cell, and more specifically, to a method for manufacturing a flash memory cell which can prevent a smiling phenomenon of an ONO dielectric film due to a re-oxidization process.

2. Discussion of Related Art

Recently, in flash devices, a program state or erase state is displayed through storage and discharging of electric charges. In such a program and erase, in case of NAND flash devices, program and erase operations are performed through FN tunneling using a high voltage of over 15V and several transistors are operated within a selected cell at the same time. Moreover, within the selected cell, only when charges as many as the number predetermined upon application of a predetermined voltage are stored, it is recognized as a cell of a program state in the flash device.

As the design rule shrinks, however, the effective channel length that may generate FN tunneling is reduced. An oxidization process is usually performed in a subsequent thermal process that has to be necessarily carried out in order to release plasma damage caused upon etching for gate formation. Further, a thickness is increased because of abnormal oxidization that occurs at the side of an ONO dielectric film by means of such a re-oxidation process, thereby causing a so-called smiling phenomenon. As a result, there is a problem that reliability of the device is degraded such as a reduced program speed because a voltage applied to the gate is transferred irregularly.

SUMMARY OF THE INVENTION

The present invention is directed to a method for manufacturing a flash memory cell that can prevent a smiling phenomenon of an ONO dielectric film due to a re-oxidization process.

According to a preferred embodiment of the present invention, there is provided a method for manufacturing a flash memory cell, comprising the steps of: forming a gate structure in which a tunnel oxide film, a floating gate, an ONO dielectric film and a control gate are stacked on a semiconductor substrate through a gate mask process and an etch process, wherein etched faces are generated on edges of the floating gate and the control gate; performing a nitrification process to form a Si—N bonding structure on the etched faces of the floating gate and the control gate; and performing an oxidization process to form an oxide film on the etched faces of the floating gate and the control gate.

In the above, the floating gate and the control gate have a single or multi-layer having doped polysilicon.

The ONO dielectric film has a lower oxide film, an intermediate nitride film and an upper oxide film stacked thereon, the lower oxide film and the upper oxide film are formed by depositing HTO using DCS ($SiH_2Cl_2$) and $N_2O$ gas as sources, and the intermediate nitride film is formed by means of a LPCVD method using $NH_3$+DCS gas as a reaction gas at a pressure of 1 to 3 Torr and temperature atmosphere of 650 to 800 □.

The nitrification process and the re-oxidization process are performed in-situ, the nitrification process includes performing RTN under $N_2$ atmosphere for about below 30 seconds, and the nitrification process is performed so that the ratio in the amount of $N_2$: Ar used as a carrier gas is over 1:10 in order to minimize nitrification under $N_2$ atmosphere. The re-oxidization process is performed under $O_2$ atmosphere for about 1 to 10 minutes.

DETAILED DESCRIPTION OF PREFERRED EMBODIMENTS

Figure 1A:
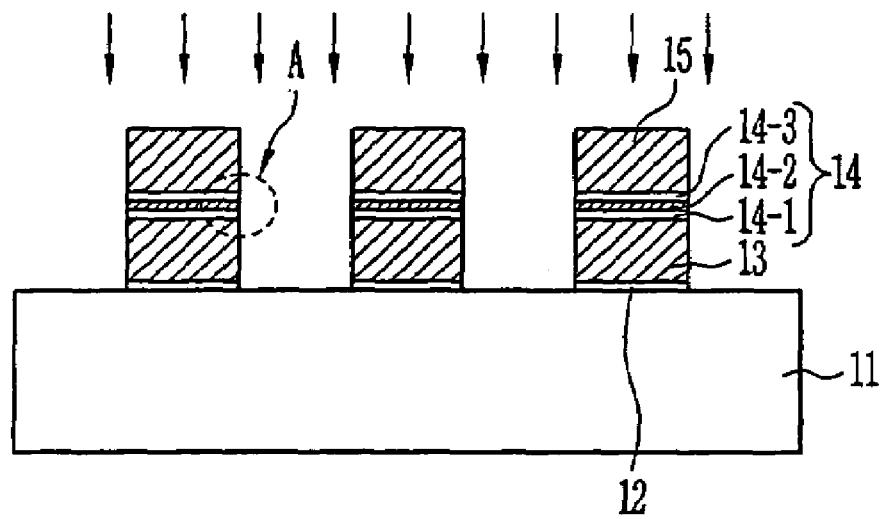
FIG. 1A to FIG. 1C are cross-sectional views illustrating a method for manufacturing a flash memory cell according to an embodiment of the present invention.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Meanwhile, in case where it is described that one film is "on" the other film or a semiconductor substrate, the one film may directly contact the other film or the semiconductor substrate. Or a third film may be intervened between the one film and the other film or the semiconductor substrate. Further, in the drawings, a thickness and size of each layer are exaggerated for convenience of explanation and clarity. Like reference numerals are used to identify the same or similar parts.

Figure 1B:
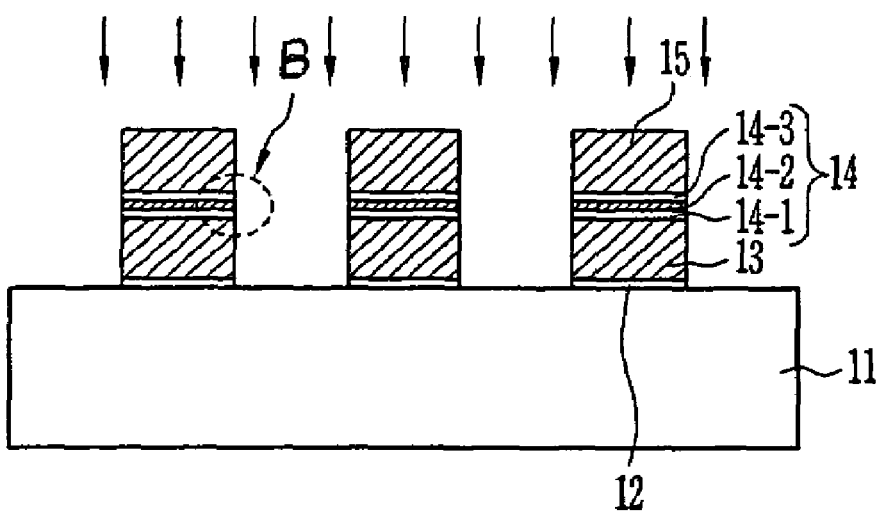
Figure 1C:
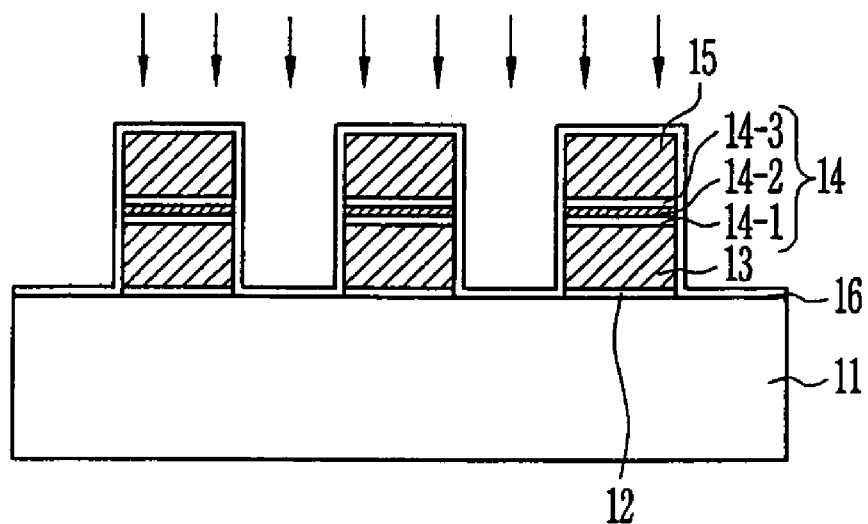
Figure 2:
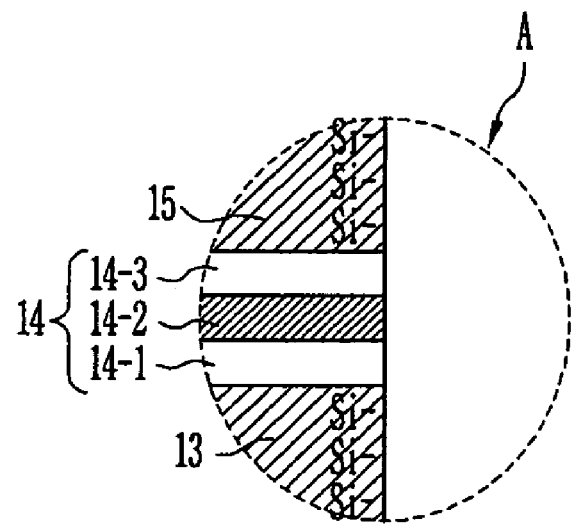
FIG. 2 is an exaggerated cross-sectional view illustrating a plasma damage state at a gate structure sidewall "A" portion in FIG. 1A by means of a gate etch process.
Figure 3:
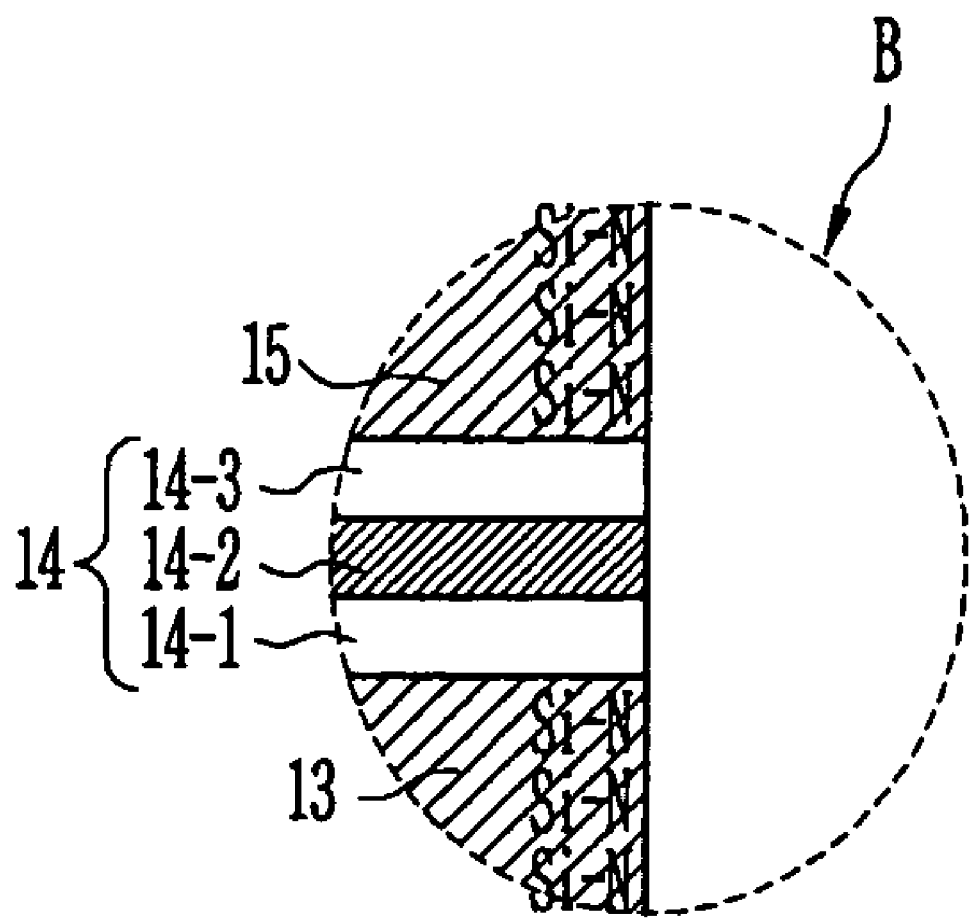
FIG. 3 is an exaggerated cross-sectional view illustrating a gate structure sidewall "B" in FIG. 1B that is experienced by rapid thermal nitrification.

FIG. 1A to FIG. 1C are cross-sectional views illustrating a method for manufacturing a flash memory cell according to an embodiment of the present invention, FIG. 2 is an exaggerated cross-sectional view illustrating a plasma damage state at a gate structure sidewall "A" portion in FIG. 1A by means of a gate etch process, and FIG. 3 is an exaggerated cross-sectional view illustrating a gate structure sidewall "B" in FIG. 1B that is experienced by rapid thermal nitrification.

Referring to FIG. 1A, a gate structure in which a tunnel oxide film 12, a floating gate 13, an ONO dielectric film 14 and a control gate 15 are stacked on a semiconductor substrate 11 through a gate mask process and etch process, is formed.

As shown in FIG. 2, during the gate etch process, etched faces of the floating gate 13 and the control gate 15 are experienced by plasma damage that causes Si-dangling bonds to be broken. In a prior art, a re-oxidization process is performed in this state. The broken dangling bond react to oxygen and is thus easily turned into an oxide film. In particular, a smiling phenomenon occurs at the boundary face between a lower oxide film 14-1 and the floating gate 13 or the boundary face between an upper oxide film 14-3 and the control gate 15 due to abnormal oxidization reaction.

Accordingly, there is a problem that reliability of the device is degraded such as a reduced program speed since a voltage applied to the gate is transferred irregularly.

In the above, the floating gate 13 has a structure in which a first polysilicon layer and a second a polysilicon layer are stacked in case of a flash memory device using a self-aligned shallow trench isolation (SA-STI) scheme. In the event that other schemes are used, the floating gate 13 may be formed to have a polysilicon layer of a single layer. Impurity ions of a proper concentration are doped into the polysilicon layer constituting the floating gate 13.

The ONO dielectric film 14 has the lower oxide film 14-1, the intermediate nitride film 14-2 and the upper oxide film 14-3 stacked thereon. The lower oxide film 14-1 and the upper oxide film and 14-3 are formed by depositing HTO (Hot Temperature Oxide) using DCS ($SiH_2Cl_2$) and $N_2O$ gas having good partial pressure-resistant properties and TDDB (Time Dependent Dielectric Breakdown) properties as sources. The intermediate nitride film 14-2 is formed by means of a LPCVD method using $NH_3$+DCS gas as a reaction gas at a low pressure of 1 to 3 Torr and temperature atmosphere of 650 to 800° C. The control gate 15 may be formed using only a doped polysilicon layer, or may have a structure in which a metal-silicide layer is stacked on the doped polysilicon layer.

By reference to FIG. 1B, in order to release plasma damage that causes Si-dangling bonds to be broken at the etched faces of the floating gate 13 and the control gate 15 during the gate etch process, nitrification process is performed. As shown in FIG. 3, incomplete Si is turned into Si—N bonding at the etched faces of the floating gate 13 and the control gate 15 by means of the nitrification process. In other words, during the nitrification process, nitrogen (N) being an inert dopant is combined with Si to form a Si—N bonding structure. Such a Si—N bonding structure serves to prohibit abnormal oxidization.

In the above, it is preferred that the nitrification process includes performing RTN (Rapid Thermal Nitrification) under $N_2$ atmosphere for about 30 seconds. This is for prohibiting generation of an abnormal doping profile when the thermal process and a re-oxidization process to be performed subsequently are performed for a long time. Furthermore, in order to minimize nitrification in the $N_2$ atmosphere, it is preferable that the ratio in the amount of $N_2$: Ar used as a carrier gas is over 1:10.

Referring to FIG. 1C, in a state where the etched faces of the floating gate 13 and the control gate 15 become the Si—N bonding structure by means of the nitrification process, the re-oxidization process for completely releasing the plasma damage caused by the gate etch process is performed. Therefore, an oxide film 16 is formed on the etched faces of the floating gate 13 and the control gate 15. It is to be noted that the oxide film 16 may be formed on other exposed surfaces.

In the above, the re-oxidization process can be performed in-situ together with the nitrification process. As the re-oxidization process is performed with the Si—N bonding structure existing, it is performed under $O_2$ atmosphere for about 1 to 10 minutes so that sufficient re-oxidization is accomplished. As such, although the re-oxidization process is performed, abnormal oxidization is prohibited by means of the Si—N bonding structure and the smiling phenomenon of the ONO dielectric film 14 thus does not occur.

According to the present invention described above, nitrogen (N) being an inert dopant is trapped in SI bonding of polysilicon constituting a floating gate and a control gate where re-oxidization occurs, and abnormal polysilicon re-oxidization is prohibited in a re-oxidization process to be performed subsequently by means of the trapped inert dopant. As a result, a smiling phenomenon of an ONO dielectric film is prevented. Accordingly, the present invention has an effect that it can secure a stabilized cell transistor capable of effectively corresponding to shrinkage of the design rule.

What is claimed is:

1. A method for manufacturing a flash memory cell, comprising the steps of:
    forming a gate structure in which a tunnel oxide film, a floating gate, an ONO dielectric film and a control gate are stacked on a semiconductor substrate through a gate mask process and an etch process, wherein etched faces are generated on edges of the floating gate and the control gate;
    performing a rapid thermal nitrification process under $N_2$ atmosphere to form a Si—N bonding structure on the etched faces of the floating gate and the control gate; and
    performing an oxidization process to form an oxide film on the etched faces of the floating gate and the control gate;
    wherein nitrogen (N) being an inert dopant is traped in Si bonding of polysilicon constituting the floating gate and the control gate where oxidation occurs.

2. The method as claimed in claim 1, wherein the floating gate and the control gate have a single or multi-layer having doped polysilicon.

3. The method as claimed in claim 1, wherein an intermediate nitride film of the ONO dielectric film is formed by means of a LPCVD method using $NH_3$+DCS gas as a reaction gas at a pressure of 1 to 3 Torr and temperature atmosphere of 650 to 800° C.

4. The method as claimed in claim 1, wherein the nitrification process and the oxidization process are performed in-situ.

5. The method as claimed in claim 1, wherein the rapid thermal nitrification process is performed for about 30 seconds.

6. The method as claimed in claim 4, wherein the nitrification process is performed so that the ratio in the amount of $N_2$:Ar used as a carrier gas is over 1:10 in order to minimize nitrification under $N_2$ atmosphere.

7. The method as claimed in claim 4, wherein the oxidization process is performed under $O_2$ atmosphere for about 1 to 10 minutes.

8. The method as claimed in claim 3, wherein the lower oxide film and the upper oxide film are formed by depositing HTO using DCS ($SiH_2Cl_2$) and $N_2O$ gas as sources.

* * * * *